US010488483B2

(12) United States Patent
Siddiqui et al.

(10) Patent No.: US 10,488,483 B2
(45) Date of Patent: Nov. 26, 2019

(54) PARAMETERIZED FPGA IMPLEMENTATION OF A REAL-TIME SENSITIVITY ENCODING RECONSTRUCTION

(71) Applicant: COMSATS Institute of Information Technology, Islamabad (PK)

(72) Inventors: Muhammad Faisal Siddiqui, Islamabad (PK); Hammad Omer, Islamabad (PK)

(73) Assignee: COMSATS Institute of Information Technology, Islambad (PK)

( * ) Notice: Subject to any disclaimer, the term of this patent is extended or adjusted under 35 U.S.C. 154(b) by 277 days.

(21) Appl. No.: 15/626,760

(22) Filed: Jun. 19, 2017

(65) Prior Publication Data

US 2017/0371018 A1    Dec. 28, 2017

(30) Foreign Application Priority Data

Jun. 22, 2016   (PK) ................................ 377/2016

(51) Int. Cl.
*G01R 33/561*   (2006.01)
*G01R 33/56*    (2006.01)
(52) U.S. Cl.
CPC ...... *G01R 33/5611* (2013.01); *G01R 33/5608* (2013.01)
(58) Field of Classification Search
CPC combination set(s) only.
See application file for complete search history.

(56) References Cited

U.S. PATENT DOCUMENTS

| | | | |
|---|---|---|---|
| 2009/0262996 A1* | 10/2009 | Sannsonov | G01R 33/4818 382/130 |
| 2010/0085050 A1* | 4/2010 | Dong | G01R 33/243 324/309 |

OTHER PUBLICATIONS

Bryan Kressler et al., "Reduction of Reconstruction Time for Time-Resolved Spiral 3D Contrast-Enhanced Magnetic Resonance Angiography Using Parallel Computing", Magnetic Resonance in Medicine, 2006, vol. 56, pp. 704-708.

(Continued)

*Primary Examiner* — Jay Patidar
(74) *Attorney, Agent, or Firm* — H.C. Park & Associates, PLC (57) ABSTRACT

A system for parameterized FPGA (Field Programable Gate Array) implementation of real-time SENSE (SENSitivity Encoding) reconstruction including: a sensitivity maps memory configured to store sensitivity map data; an aliased image memory configured to store aliased image data acquired from a scanner; a reconstructed image memory configured to store reconstructed image data; a parameterized complex matrix multiplier; a pseudo-inverse calculator; a magnitude image block; and a controller; wherein sensitivity map data from the sensitivity maps memory is transferred to the pseudo-inverse calculator; wherein data from the pseudo-inverse calculator and the aliased image data from the aliased image memory is transferred to the complex matrix multiplier; wherein data from the complex matrix multiplier is transferred to the magnitude image block; wherein the controller is configured to generate an address of the sensitivity map memory and an address of the aliased image memory to access the encoding matrix and corresponding aliased image data and also configured to generate an address of the reconstructed image memory to store the reconstructed image data.

12 Claims, 6 Drawing Sheets

(56) References Cited

OTHER PUBLICATIONS

Michael S. Hansen et al., "Cartesian SENSE and k-t SENSE Reconstruction Using Commodity Graphics Hardware", Magnetic Resonance in Medicine, 2008, vol. 59, pp. 463-468.
Michael Schacht Hansen et al., "Gadgetron: An Open Source Framework for Medical Image Reconstruction", Magnetic Resonance in Medicine, 2013, vol. 69, pp. 1768-1776.
H. Shahzad et al., "Parallel MRI Reconstruction Algorithm Implementation on GPU", Applied Magnetic Resonance, DOI 10.1007/s00723-015-0728-6, 2016, vol. 47, pp. 53-61.
Limin Li et al., "Design of an MR image processing module on an FPGA chip", Journal of Magnetic Resonance, journal homepage: www.elsevier.com/locate/jmr, vol. 255, 2015, pp. 51-58.
Haris Saybasili et al., "HTGRAPPA: Real-Time B1-Weighted Image Domain TGRAPPA Reconstruction", Magnetic Resonance in Medicine, 2009, vol. 61, pp. 1425-1433.
Haris Saybasili et al., "Real-time imaging with radial GRAPPA: Implementation on a heterogeneous architecture for low-latency reconstructions", Magnetic Resonance Imaging, journal homepage: www.mrijournal.com, vol. 32, 2014, pp. 747-758.
Iuliana Chiuchisan et al., "Implementation of Real-Time System for Medical Image Processing using Verilog Hardware Description Language", Recent Researches in Medicine, Biology and Bioscience, ISBN: 978-960-474-326-1, pp. 66-69.
Ishaan L. Dalal et al., "A Reconfigurable FPGA-based 16-Channel Front-End for MRI", Center for Signal Processing, Communications and Computer Engineering Research, pp. 1860-1864.
S.S. Stone et al. "Accelerating advanced MRI reconstructions on GPUs", journal homepage: www.elsevier.com/locate/jpdc, J. Parallel Distrib. Comput., vol. 66, 2006, pp. 1307-1318.
David J. Larkman et al., "Parallel magnetic resonance imaging", Physics in Medicine and Biology, vol. 52, 2007, DOI: 10.1088/0031-9155/52/7/R01, pp. R15-R55.
Klaas. P. Pruessmann et al., "SENSE: Sensitivity Encoding for Fast MRI", Magnetic Resonance in Medicine, vol. 42, 1999, pp. 952-962.
Mark A. Griswold et al., "Generalized Autocalibrating Partially Parallel Acquisitions (GRAPPA)", Magnetic Resonance in Medicine, vol. 47, 2002, pp. 1202-1210.
Gordon E. Sarty, "Cyclic generalized projection MRI", Magnetic Resonance Imaging, journal homepage: www.mrijournal.com, vol. 33, 2015, pp. 304-311.
Clarissa Zimmerman Cooley et al., "Two-Dimensional Imaging in a Lightweight Portable MRI Scanner without Gradient Coils", Magnetic Resonance in Medicine, 2014, pp. 1-12.
Vadim S. Zotev et al., "Parallel MRI at microtesla fields", Los Alamos National Laboratory, Group of Applied Modern Physics, pp. 1-12.
Katsumi Kose et al., "High Resolution NMR Imaging using a High Field Yokeless Permanent Magnet", Magnetic Resonance in Medicine Science, 2011, vol. 10, No. 3, pp. 159-167.
Yu Wang et al., "Hardware Computing for Brain Network Analysis", Department of Electronic Engineering, 2010, 2nd Asia Symposium on Quality Electronic Design, 2010, 4 pages.
Prasanna Sundararajan, "High Performance Computing Using FPGAs", XILINX, WP375, Sep. 10, 2010, pp. 1-15.
Karl Pereira et al., "Spectral Method Characterization on FPGA and GPU Accelerators", 2011 International Conference on Reconfigurable Computing and FPGAs, DOI 10.1109/ReConFig.2011.83, 2011, pp. 487-492.
Philip M. Robson et al., Comprehensive Quantification of Signal-to-Noise Ration and g-Factor for Image-Based and k-Space-Based Parallel Imaging Reconstructions, Magnetic Resonance in Medicine, vol. 60, 2008, pp. 895-907.

* cited by examiner

4 Coils phantom dataset SNR maps

CPU: Mean SNR = 39.43dB   FPGA: Mean SNR = 34.64dB   GPU: Mean SNR = 35.42dB

6 Coils phantom dataset SNR maps

CPU: Mean SNR = 39.44dB   FPGA: Mean SNR = 35.39dB   GPU: Mean SNR = 37.45dB

8 Coils phantom dataset SNR maps

CPU: Mean SNR = 39.69dB   FPGA: Mean SNR = 36.84dB   GPU: Mean SNR = 39.47dB
(a)                        (b)                        (c)

FIG. 6

CPU: Mean SNR = 30.97dB    FPGA: Mean SNR = 28.17dB    GPU: Mean SNR = 29.34dB

CPU: Mean SNR = 30.98dB    FPGA: Mean SNR = 30.12dB    GPU: Mean SNR = 30.96dB

CPU: Mean SNR = 31.02dB    FPGA: Mean SNR = 31.96dB    GPU: Mean SNR = 31.02dB
(a)                        (b)                        (c)

PARAMETERIZED FPGA IMPLEMENTATION OF A REAL-TIME SENSITIVITY ENCODING RECONSTRUCTION

CROSS-REFERENCE TO RELATED APPLICATION

This application claims priority from and the benefit of Pakistani Provisional Patent Application No. 377/2016, filed on Jun. 22, 2016, which is hereby incorporated by reference for all purposes as if fully set forth herein.

BACKGROUND

Field

Exemplary embodiments relate to parallel MRI (pMRI) system. More particularly, exemplary embodiments relate to a system for parameterized FPGA (Field Programable Gate Array) implementation of real-time SENSE (SENSitivity Encoding) reconstruction.

Discussion of the Background

Recent advancements in parallel imaging (PI) significantly reduce the data acquisition time in MRI (Magnetic Resonance Imaging) but increase the reconstruction time and also the complexity of the reconstruction algorithms. Therefore, parallel MRI (pMRI) requires more sophisticated hardware platforms for image reconstruction. General purpose single core processor computer systems are not adequate to handle the computational load involved in pMRI reconstruction. Consequently, the modern MRI scanners have multi-core central processing unit (CPU) systems for image reconstruction purposes. Moreover, computer clusters have also been used for pMRI reconstruction in the past. However, general purpose multi-core CPU computer systems are not application specific and do not offer massively parallel computations. The computer clusters platform for MR image reconstruction is expensive, not easy to maintain, and normally installed far from the MRI scanner, therefore, it is not a feasible practical solution. In literature, different feasible alternative hardware platforms have been exploited instead of large clusters systems for MRI reconstruction. GPU and FPGA offer highly parallel computing, which is ideal for pMRI reconstruction.

Over the years, great development progress in parallel MRI field has been done; thereby many solutions are investigated for pMRI reconstruction techniques. These techniques can be categorized into 'image-domain' methods (e.g. SENSE) and 'k-space' methods (e.g. GRAPPA), and they are the most well known and clinically used techniques. Many different real-time parallel imaging reconstruction algorithms have also been investigated. All these techniques are able to reconstruct the images once the raw data is available on the workstation. However, this work proposes a novel FPGA implementation of real-time SENSE reconstruction right on the receiver coil data acquisition system with no need to transfer all the raw data to the server (workstation).

SENSE is computationally intensive by nature, which may consume longer time and power if not optimally implemented in hardware. Different hardware platforms are used to implement real-time SENSE reconstruction effectively. In the previously published work, FPGAs are used to accelerate the MRI reconstruction and offer real-time reconstruction as well. Different FPGA based design for pMRI reconstruction has been proposed in the past. However, these techniques are only capable to reconstruct the images from the fully-sampled parallel MRI data. Moreover, GPU based implementations have also recently attracted research interests for SENSE reconstruction. However, all the GPU based implementations have an additional overhead time (data transfer from the host machine to the GPU memory) which leads to increase the overall reconstruction time. Furthermore, GPU based implementations can only start the processing once the pMRI raw data is available on the workstation, therefore, all the pMRI raw data is needed to transfer to the workstation.

It is desireable to design a high throughput system for SENSE algorithm. A new scalable pipelined architecture design, implemented on Field Programmable Gate Array (FPGA), for parallel MRI reconstruction is discussed herein. To increase the efficiency of the proposed system, hardware modules are designed according to the algorithmic requirements and capable to provide reconstruction right on the data acquisition system of the MRI. The experimental results show that the discussed system is 280 and 28 times faster than the conventional multi-core CPU and GPU based reconstructions of SENSE, respectively. In addition, the quality of the reconstructed images is remarkable and maintained significant artefact power ($<2.45 \times 10^{-4}$) and SNR (30+ dB) values. The results indicate that the discussed system can prove to be a significant tool for parallel MRI reconstruction in modern MRI scanners and its low power feature is remarkable for portable MRI scanners.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a system for parameterized FPGA (Field Programable Gate Array) implementation of real-time SENSE (SENSitivity Encoding) reconstruction including: a sensitivity maps memory configured to store sensitivity map data; an aliased image memory configured to store aliased image data acquired from a scanner; a reconstructed image memory configured to store reconstructed image data; a parameterized complex matrix multiplier; a pseudo-inverse calculator; a magnitude image block; and a controller; wherein sensitivity map data from the sensitivity maps memory is transferred to the pseudo-inverse calculator; wherein data from the pseudo-inverse calculator and the aliased image data from the aliased image memory is transferred to the complex matrix multiplier; wherein data from the complex matrix multiplier is transferred to the magnitude image block; wherein the controller is configured to generate address of the sensitivity maps memory and address of the aliased image memory, and configured to access the sensitivity map data and aliased image data, and also configured to generate an address of the reconstructed image memory to store the reconstructed image data.

Each of the sensitivity maps memory, the aliased image memory, and the reconstructed image memory may be accessible independently.

The parameterized complex matrix multiplier may be configured to compute a matrix multiplication of two matrices having complex values, wherein the parameterized feature of the complex matrix multiplier allows the parameterized complex matrix multiplier to be reused for different data-widths complex matrix multiplications.

The pseudo-inverse calculator may further include a matrix transposer, matrix multiplier, square matrix inversion calculator and complex matrix multiplier.

The pseudo-inverse calculator may be configured to compute the inverse of a non-square matrix.

The matrix transposer may be configured to generate a complex conjugate transpose of the given matrix by rearranging the inputs and changing the sign of a complex part of the inputs.

The square matrix inversion calculator may be configured to calculate the inverse of a matrix.

The magnitude image block may include at least two square function modules and at least one square root module.

The memory modules may be dual port BRAMs whereas the number and size of BRAMs used are dependent upon an acceleration factor and a number of receiver coils used for real-time SENSE reconstruction.

The real-time SENSE reconstruction may be implemented on a receiver coil data acquisition system.

The time for real-time SENSE reconstruction may be 0.164 ms @200 MHz for 256×256 images where an acceleration factor may be 2.

The time for real-time SENSE reconstruction may be lesser than the MRI data acquisition time.

The transmission of the sensitivity map data, and the aliased image data may skip a workstation of MRI Scanner.

According to another exemplary embodiment, a system for parameterized FPGA (Field Programable Gate Array) implementation of real-time SENSE (SENSitivity Encoding) reconstruction include: at least one processing core and at least three memory units, wherein the at least one processing core is configured to execute computer-readable instructions, wherein the at least three memory units are configured to: store sensitivity map data; store aliased image data acquired from a scanner; store reconstructed image data; wherein the at least one processing core is configured to: compute a matrix multiplication of two matrices having complex values; compute and calculate the inverse of a matrix; generate a complex conjugate transpose of a given matrix by rearranging the inputs and changing the sign of a complex part of the inputs; produce absolute of the image from the reconstructed image data; transfer and access the sensitivity map data, the aliased image data, and the reconstructed image data.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

In exemplary embodiments, parameterized complex matrix multiplier, pseudo-inverse calculator, magnitude image block, controller, matrix transposer, matrix multiplier, square matrix inversion calculator, complex matrix multiplier, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, parameterized complex matrix multiplier, pseudo-inverse calculator, magnitude image block, controller, matrix transposer, matrix multiplier, square matrix inversion calculator, complex matrix multiplier and/or one or more components thereof may include or otherwise be associated with one or more memories (e.g., sensitivity map memory, aliased image memory, and reconstructed image memory) including code (e.g., instructions) configured to cause sensitivity parameterized complex matrix multiplier, pseudo-inverse calculator, magnitude image block, controller, matrix transposer, matrix multiplier, square matrix inversion calculator, complex matrix multiplier and/or one or more components thereof to perform one or more of the features, functions, processes, etc., described herein.

The memories (e.g., sensitivity map memory, aliased image memory, and reconstructed image memory) may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

SENSE is an image-domain algorithm in parallel MRI where scan time is reduced by acquiring fewer lines in k-space, which reduces the field of view (FOV) producing aliased images. In SENSE, the missing lines of the k-space are estimated by the knowledge of the receiver coil sensitivities. Coil sensitivity maps of the receiver coil elements are used to calculate the aliased signal component at each pixel location in the aliased image and these signals are allocated at the actual pixel positions in the unwrapped (reconstructed) image. Acceleration factor (denoted by "R") describes the extent of under-sampling in k-space. A pre-scan is usually performed at the beginning of the MRI examination to gather information about the coil sensitivity maps. SENSE is a widely used algorithm in clinical scanners to reconstruct the unfolded image from the under-sampled data.

The general SENSE reconstruction equation is given as $$M=(C^H\psi^{-1}C)^{-1}C^H\psi^{-1}S \qquad \text{Equation 1}$$

Where "M" is a vector of reconstructed image pixels and "S" is a vector containing the aliased pixels information. "C" is the encoding matrix and the complex conjugate transpose of the encoding matrix is denoted by "$C^H$". $\Psi$ describes the noise covariance matrix. The number of rows of encoding matrix "C" correspond to the number of receiver coils, and the number of columns depend upon the acceleration factor R. In practice a noise decorrelation is performed before the reconstruction to eliminate the noise covariance matrix. Thus, the Eq. (1) will become:

$$M=(C^HC)^{-1}C^HS \qquad \text{Equation 2}$$

The core process to implement SENSE reconstruction is to compute the inverse of a matrix "C". Matrix inversion is a computationally intensive mathematical operation.

The importance of speed and power in modern portable MRI scanners generates the requirement to develop application specific hardware for real-time SENSE reconstruction. To implement such reconstruction algorithms different hardware platforms may be used. Table 1 provides a comparison of some of these platforms, including CPUs, GPUs and FPGAs. A detailed description of a similar comparistion may be found in Prasanna Sundararajan, *High Performance Computing Using FPGAs*, XILINX WP375 (Sep. 10, 2010), Wang et al., *Hardware Computing for Brain Network Analysis*, 2ND ASIA SYMPOSIUM ON QUALITY ELECTRONIC DESIGN 219-22 (2010), and Pereira et al., *Spectral Method Characterization on FPGA and GPU Accelerators*, INTERNATIONAL CONFERENCE ON RECONFIGURABLE COMPUTING AND FPGAS, 487-92 (2011), which all are incorporated herein by reference as if set fully set forth herein.

TABLE 1

Comparison of CPU, GPU and FPGAs

|  | CPU (Core i7) | GPU (GTX 780) | FPGAs (Virtex-6) |
| --- | --- | --- | --- |
| Peak GFlops | 70 | 3977 | 450 |
| Design Effort | Easy | Middle | Hard |
| Design Size | Large | Large | Small |
| ASIC Implementation | No | No | Yes |
| Computational Density per Watt | Less | Medium | High |
| Power (W) | 130 | 250 | 7 |

According to an exemplary embodiment, an FPGA implementation of parameterized architectural design of SENSE algorithm for different number of receiver coils (4, 6 and 8) for an acceleration factor of 2 as implemented in HDL (Verilog) on ML605 evaluation Virtex 6 kit is presented. The input data matrices (Sensitivity maps data and the acquired aliased images data, both could be three-dimensional) are stored in the memory (dual-port BRAM) of the FPGA. The SENSE architecture module performs the reconstruction operation on the given input (fetching from memory) and then the reconstructed output is stored in the "reconstructed image" memory. Furthermore, the reconstructed image (could be two-dimensional) is transferred to MATLAB (R2013a) via UART transmission for analysis and comparison. The MRI data is complex; therefore real part and imaginary part are stored separately in the memories. All the memories in this exemplary embodiment are dual-port BRAMs and can be accessible independently, so the memories deal with the complex data efficiently by assigning one port to real part and second port to imaginary part. The size and the number of the memories required is dependent upon the acceleration factor and the number of receiver coils used for the scan.

Figure 1:
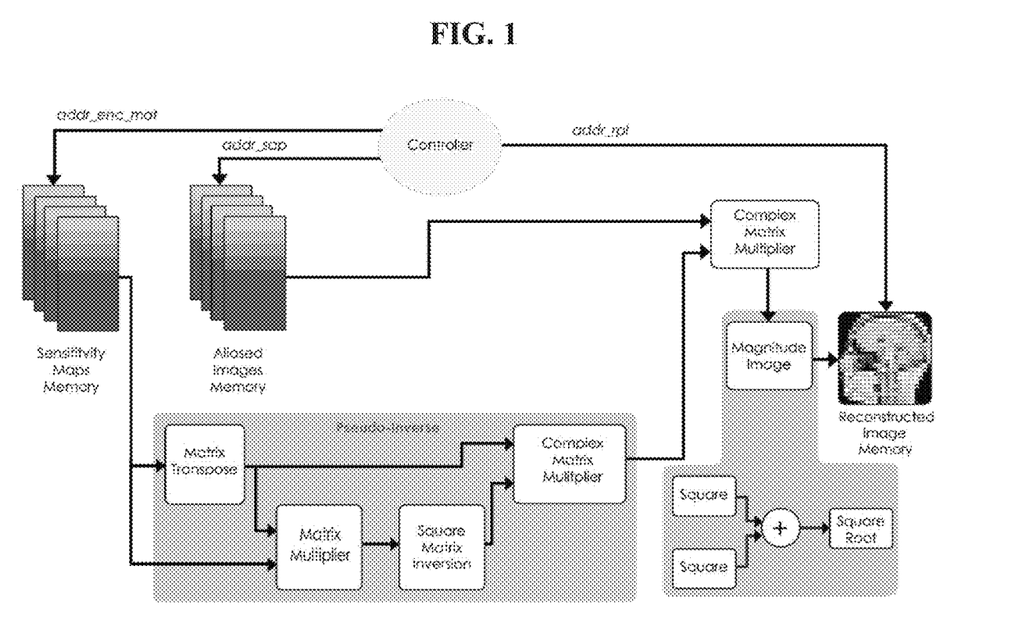
FIG. 1 illustrates a flow diagram of an exemplary embodiment of SENSE implementation.

According to an exemplary embodiment, FIG. 1 shows a flow diagram of an exemplary embodiment of SENSE implementation. Generally, SENSE reconstruction consists of a loop over a set of aliased pixels (defined by the number of receiver coils and acceleration factor). Thus, Eq. 2 has to be computed for each set of aliased pixels. The controller generates the address of the sensitivity maps memory (addr_enc_mat) and aliased image memory (addr_sap) to fetch the corresponding encoding matrix "C" and set of aliased pixels "S", respectively. Once the data is fetched from the memory, the processing module starts the computational process of the SENSE reconstruction. Inside the processing module of SENSE reconstruction, the core process is to compute the pseudo inverse of encoding matrix "C". The other modules used in the pseudo-inversion is matrix transpose, square matrix inversion, complex matrix multiplier and divider. The parameterized complex matrix multiplier module is designed by using 4 complex multipliers and 4 add/sub modules. The complex matrix multiplier is capable to compute the matrix multiplication of two matrices having complex values. Moreover, the parameterized feature of complex matrix multiplier allows the module to change the internal data-widths of that module. Divider module is designed by using divider Xilinx IP-core (Intellectual Property-core). It is used in intermediate operation of the pseudo inverse module. Divider module consumes more resources than other modules; therefore an effort is made to use less number of divisions to implement the results in this architecture. In this exemplary embodiment, left pseudo inverse method is used for the inversion of a non-square matrix. Mathematically left pseudo inverse is defined as:

$$C^{-}=(C^{H}C)^{-1}C^{H} \quad \text{Equation 5}$$

The matrix transpose module generates the complex conjugate transpose of the given encoding matrix i.e., "$C^H$". It is done by rearranging the inputs (rows to columns) and changing the sign of the complex part of the inputs. Square matrix inverse block calculates the inverse of a complex matrix multiplier result ($C^H C$). Adjoint method may be used for square matrix inversion. In adjoint method, the adjoint of a matrix is divided by its determinant to compute the inverse of a matrix. The reciprocal of the determinant value is calculated and then it is multiplied by each element of the adjoint matrix to reduce the number of divisions in the architecture. Finally, the resultant matrix provided by the square matrix inverse block is multiplied by the conjugate transpose matrix "$C^H$" to complete the left pseudo-inverse operation. Pseudo-inverse module output is multiplied by the folded image input to compute the reconstructed image (Conventional SENSE reconstruction).

According to one exemplary embodiment, the SENSE implementation is aimed to produce the final image right on the receiver coil data acquisition system; therefore some additional steps are introduced to compute the absolute of the complex image. To find the absolute value of a complex number, sum-of-squares of the real and imaginary part is calculated and then CORDIC IP-core is used to compute the square root of that number. Thus, the final output (a set of unaliased pixels) is generated by the magnitude image block. The magnitude image block includes at least two square function modules and at least one square root module. The controller unit reallocates these pixels to their right position in the reconstructed image by providing the address location "addr_rpl". Finally, only the magnitude image of the reconstructed data is transferred from the receiver coil system to the MRI workstation to visualize the image.

Moreover, the variable data width is used in intermediate connections of the architecture. The usage of the variable bit-width in the intermediate data-path provided an efficient use of the silicon area and reduced the power consumption.

According to one exemplary embodiment, the SENSE implementation has a latency of 1-clock cycle to compute one sample (set of aliased pixels) of SENSE reconstruction. The total number of clock cycles required for SENSE reconstruction of the image of size (X×Y), with acceleration factor R, are $$N_{C,C} = \frac{X \times Y}{R} \quad \text{Equation 6}$$

where "$N_{C,C}$" is the total number of clock cycles required by the proposed design to compute the SENSE reconstruction. According to other exemplary embodiments, SENSE code could be implemented in standard C language on multi-core CPU (Core i7, with 2.9 GHz clock and 4 GB RAM). Moreover, SENSE code could also be implemented on GPU. NVIDIA GeForce GTX 780 GPU (with 2304 cores and memory of 3 MB) was used in these exemplary embodiments. In GPU based SENSE implementation, the MRI complex data (sensitivity maps data and aliased images data) is transferred from the host system to the device (GPU) using PCI interface. The operations required in SENSE algorithm are divided in multiple threads in GPU implementation, which are executed in parallel. Furthermore, the registers are used to store the temporary variables used in threads instead of global memory. All threads write back their output results to the GPU global memory after finishing their tasks. Finally, the reconstructed image is then transferred to the host system via the PCI interface. The output results of the GPU, which contain the reconstructed image (in Complex domain) are imported in MATLAB for comparison and further evaluation.

According to one of the exemplary embodiments, the MRI datasets are acquired using GE MR450, 1.5T MRI scanner with Gradient Echo sequence and the following parameters: Slice Thickness 3 mm, Matrix Size 256×256, Flip Angle 90°, TR 520 ms, TE 15 ms, FOV 20 cm. One phantom and one subject were scanned with written informed consent for the associated experiments of this exemplary embodiment. The sensitivity maps have been obtained by using the pre-scan method. A separate quick calibration scan was acquired which is needed to estimate the sensitivity maps in the pre-scan method. Low-resolution full FOV images from each receiver coil were obtained. The calibration scan was acquired with 2D fast gradient echo with low spatial resolution. The scan parameters were fixed except the slice thickness. The quick scan (calibration scan) consumes approximately 6 to 12 seconds and it is fast enough to allow breath-holding for body scanning. In pre-scan method, low-resolution full FOV images from each receiver coil are obtained, and then the following steps are applied to estimate the receiver coil sensitivities: (1) Dividing each of these images by the sum-of-squares image to remove anatomical details in the acquired images (2) Polynomial fitting is applied to each image based on the non-background data (3) Adding the background details of the poly-fit data to the foreground of the low-resolution image (4) Gaussian smoothing is applied to produce sensitivity map data for each coil. The dimensions of the sensitivity map data (matrix), aliased image data (under-sampled) and original image data (fully-sampled) are shown in Table 2.

TABLE 2

Datasets dimensions

|  | 4 Coils | 6 Coils | 8 Coils |
|---|---|---|---|
| Aliased image | 128 × 256 × 4 | 128 × 256 × 6 | 128 × 256 × 8 |
| Sensitivity maps image | 256 × 256 × 4 | 256 × 256 × 6 | 256 × 256 × 8 |
| Fully sampled image | 256 × 256 | 256 × 256 | 256 × 256 |

To quantify the reconstruction performance of the proposed design, artefact power (AP) and signal to noise ratio (SNR) maps are calculated.

Artefact power (AP) is based on "Square Difference Error" concept. Mathematically, AP can be defined as:

$$AP = \frac{\sum \||I^{reference}(x, y)| - |I^{reconstructed}(x, y)|\|^2}{\sum |I^{reference}(x, y)|^2} \quad \text{Equation 7}$$

where $I^{reference}$ is the fully sampled (Full FOV) image and $I^{reconstructed}$ represents the reconstructed image. The above formula reveals that AP will be zero, if $I^{reference} = I^{reconstructed}$, which means that the reconstructed image is identical to the reference image. Similarly, if the reconstructed image and reference image are significantly different with each other, then AP will be a bigger value (i.e., closer to 1). According to one of the exemplary embodiments, SNR map is calculated using "Pseudo Multiple Replica" approach. In clinical parallel imaging applications, this technique is universally applicable for a quantitative validation of the reconstructed images. In this method, correctly scaled and correlated synthetic random noise is added to the acquired k-space before "black-box" image reconstruction. The same process is repeated 100 (or more) times to produce a stack of independent image replicas with different synthetic noise each time. The noise can be calculated using these replica images by emulating the gold-standard actual multiple replica method. Mean SNR can be evaluated using the following mathematical expression:

$$SNR_{mean} = \frac{\sum SNR_{map}(x, y)}{X \times Y} \quad \text{Equation 8}$$

where X and Y represent the total number of rows and columns of the image, respectively. The proposed architecture code for FPGA (ML605-Virtex-6, XC6VLX240T) has been synthesized using Xilinx ISE 13.2 software to find the maximum operating frequency and resource utilization of the proposed architecture. The information related to the number of resources, look up tables (LUTs), and DSP slices used by the proposed architecture, is gathered after performing the post place and route procedure on XILINX tool. Table 3 shows the details of slice logic utilization of the proposed architecture. The proposed architecture utilizes less than 1% of the registers, 49% of LUTs and 94% of the available DSP48E1s modules.

TABLE 3

Device utilization of the architecture

| Device Utilization | Number of utilization |
|---|---|
| Maximum Operating Frequency (MHz) | 604.778 |
| Registers | 15 |
| LUTs | 74769 |
| DSP48E1s | 729 |

The exemplary architecture has been tested using the phantom and the human head data, acquired using GE MR450, 1.5T MRI scanner. The dimensions of the aliased image (under-sampled by factor 2) are: 128×256×4, 128×256×6 and 128×256×8 for four, six and eight receiver coils, respectively. The performance comparison of SENSE reconstruction in terms of computation time for FPGA, GPU and multi-core CPU is shown in Table 4.

TABLE 4

Computation time comparison between multi-core CPU, GPU and the proposed architecture reconstruction

| Number of receiver coils (with R = 2) | SENSE computation time (ms) ||||||||
|---|---|---|---|---|---|---|---|---|
| | Multi-core CPU | GPU (Kernel and data transfer) ||| GPU (Kernel only) ||| FPGA |
| | | $1^1$ | $2^2$ | $2^3$ | $1^1$ | $2^2$ | $2^3$ | (@ 200 MHz) |
| 4 | 18 | 1.8 | 2.6 | 1.6 | 0.56 | 1.0 | 0.7 | 0.164 |
| 6 | 31 | 2.2 | 3.1 | 2.3 | 0.85 | 1.4 | 1.0 | 0.164 |
| 8 | 47 | 3.5 | 4.7 | 2.9 | 1.13 | 1.7 | 1.2 | 0.164 |

[1]"Cartesian SENSE and k-t SENSE reconstruction using commodity graphics hardware", by Hansen et al., Magn Reson Med, 463-468, 2008.
[2]"Parallel MRI Reconstruction Algorithm Implementation on GPU", by Shahzad et al., Appl Magn Reson, 1-9, 2016.
[3]The same method used as in 2 with modern GPU (GTX 780).

Figure 2:
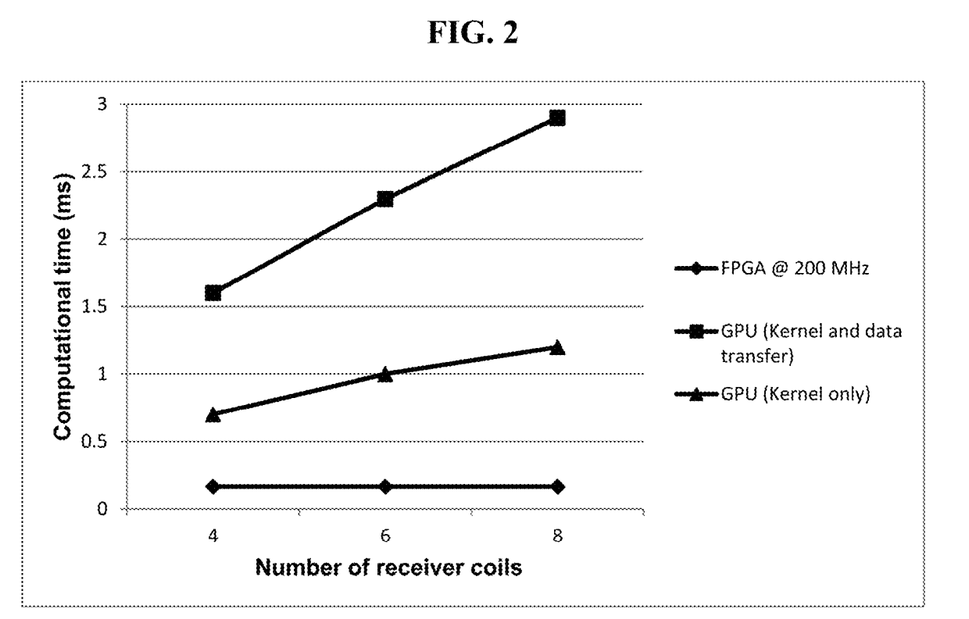
FIG. 2 illustrates computational time comparison between FPGA and GPU for different number of receiver coils.

The results show that the computation time of the exemplary architectural design for FPGA is remarkably smaller (approximately two hundred eighty times better) than the multi-core CPU based reconstruction and almost 28 times faster than the GPU based implementation, when operated at 200 MHz frequency. This is because the CPU implementation is purely software based method and uses sequential operations, whereas FPGA implementation is hardware based approach and each operation is executed in parallel. In GPU implementations of SENSE, MRI raw data is stored in the CPU memory; therefore, the data transferring overhead originates in GPU case and this takes a majority of the computation time. So the total SENSE reconstruction time in GPU implementations are composed of: (1) the kernel execution time in which SENSE algorithm operations are done, and (2) data transfer overhead time in which data is transferred to the device (GPU). In Table 4 both the times are shown for better comparison. However, the results show that the proposed FPGA based design consumes the same time for any number of receiver coils (8 or less) because it has been optimised for 8 receiver coils. The graphical representation of the computation time of the GPU and FPGA implementations is illustrated in FIG. 2.

Figure 3:
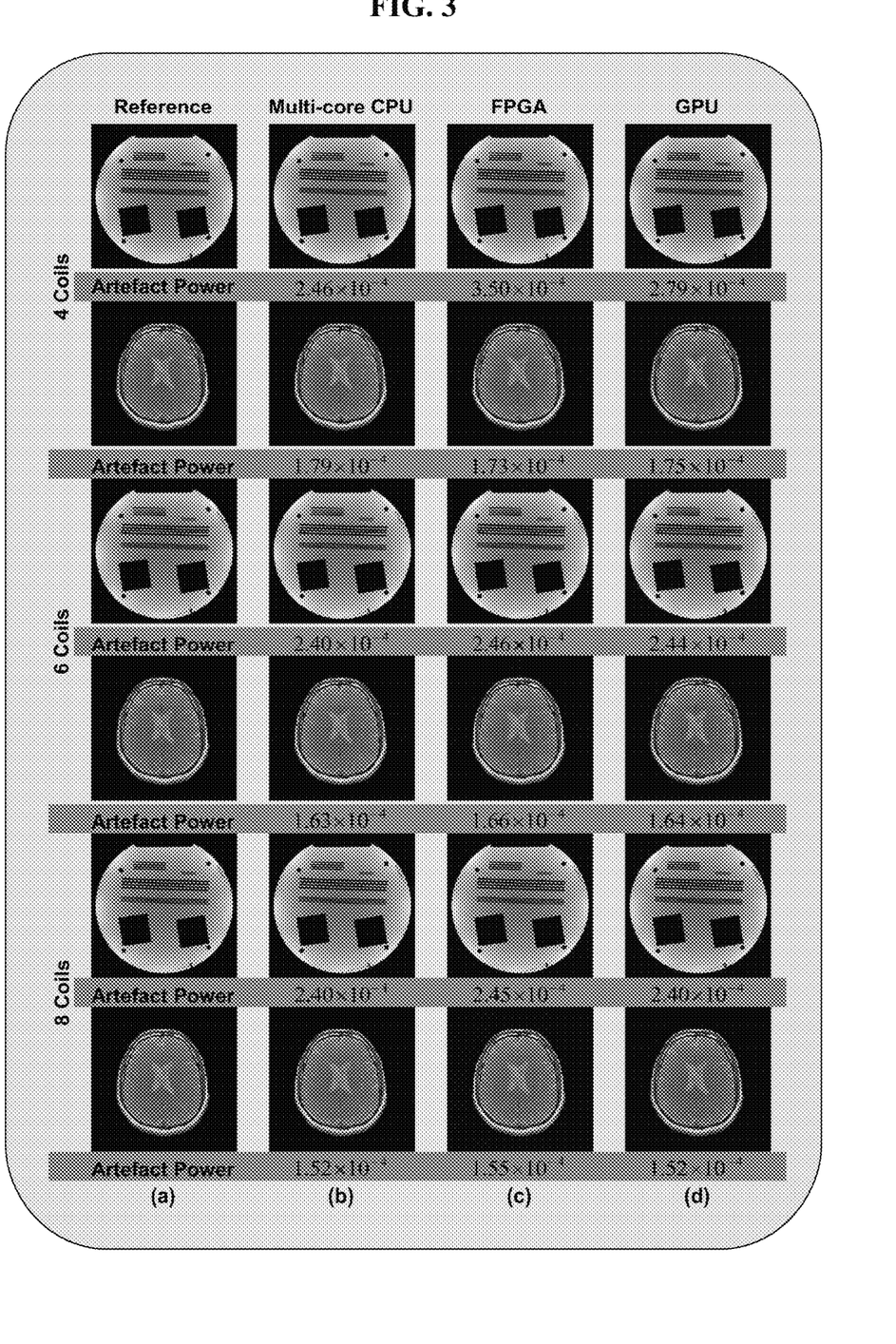
FIG. 3 illustrates reference images and reconstructed images with their artefact power values for (a) a Reference image, (b) a Multi-core CPU reconstructed image, (c) a Proposed design reconstructed image, and (d) a GPU reconstructed image.

The exemplary GPU implementation consumed approximately 4.7 ms to reconstruct the images using SENSE algorithm for a dataset of 256×256 matrix, 8 receiver coils and R=2, that is 28 times slower than the FPGA reconstruction performed in this paper. Furthermore, the exemplary FPGA implementation performance compared with GPU implementation is increased by 21 in terms of speed-up factor. One exemplary MR reconstruction (2D-FFT) time referred to here is 2.5 ms for 128×128 fully-sampled parallel MRI dataset. However, this time will increase almost to double for 256×256 matrix size image. Moreover, parallel MRI is a more advanced technique than the conventional (2DFFT) MR image reconstruction. The acquisition time of the parallel MRI (with acceleration factor=2) is lesser than the non-accelerated parallel MRI scan; therefore, the total scan time (acquisition+reconstruction) consumed by the proposed FPGA implementation is significantly smaller than some other method proposed in the field. FIG. 3 illustrates the images reconstructed using the multi-core CPU, FPGA (proposed hardware design) and GPU for different number of receiver coils (4, 6 and 8 receiver coils). In FIG. 3, column (a) presents the reference image (fully-sampled image), column (b) shows the multi-core CPU reconstructed images, and column (c) and column (d) illustrate the FPGA and GPU reconstructed images, respectively. Artefact power is used as a quantification parameter for evaluating the quality of the reconstructed images. Smaller values of artefact power indicate a reconstructed image with better quality. The artefact power of each reconstructed image is given in FIG. 3.

The results show that the FPGA reconstructed images (from the under-sampled data) are almost identical to the original images with low artefact power values, i.e., $3.5 \times 10^{-4}$, $2.46 \times 10^{-4}$ and $2.45 \times 10^{-4}$ for 4, 6 and 8 receiver coils phantom datasets, respectively. Similarly, for human brain datasets the artefact powers are $1.73 \times 10^{-4}$, $1.66 \times 10^{-4}$ and $1.55 \times 10^{-4}$ for 4, 6, and 8 receiver coils, respectively. The GPU reconstructed images are also almost identical to the original images. Artefact power of the GPU reconstructed images are in the acceptable range and values are $2.79 \times 10^{-4}/$, $2.44 \times 10^{-4}/1.64 \times 10^{-4}$ and $2.40 \times 10^{-4}/1.52 \times 10^{-4}$ (Phantom/Brain) for 4, 6 and 8 receiver coils datasets, respectively. Similarly, the artefact values for multi-core CPU reconstructed images are $2.46 \times 10^{-4}/1.79 \times 10^{-4}$, $2.40 \times 10^{-4}/1.63 \times 10^{-4}$ and $2.40 \times 10^{-4}/1.52 \times 10^{-4}$ (Phantom/Brain) for 4, 6 and 8 receiver coils datasets, respectively. The artefact power of the proposed architectural design reconstruction is almost similar to other platforms (CPU or GPU) reconstruction; and gives satisfactory results for an acceptable artefact power, as shown by FIG. 3.

Figure 4:
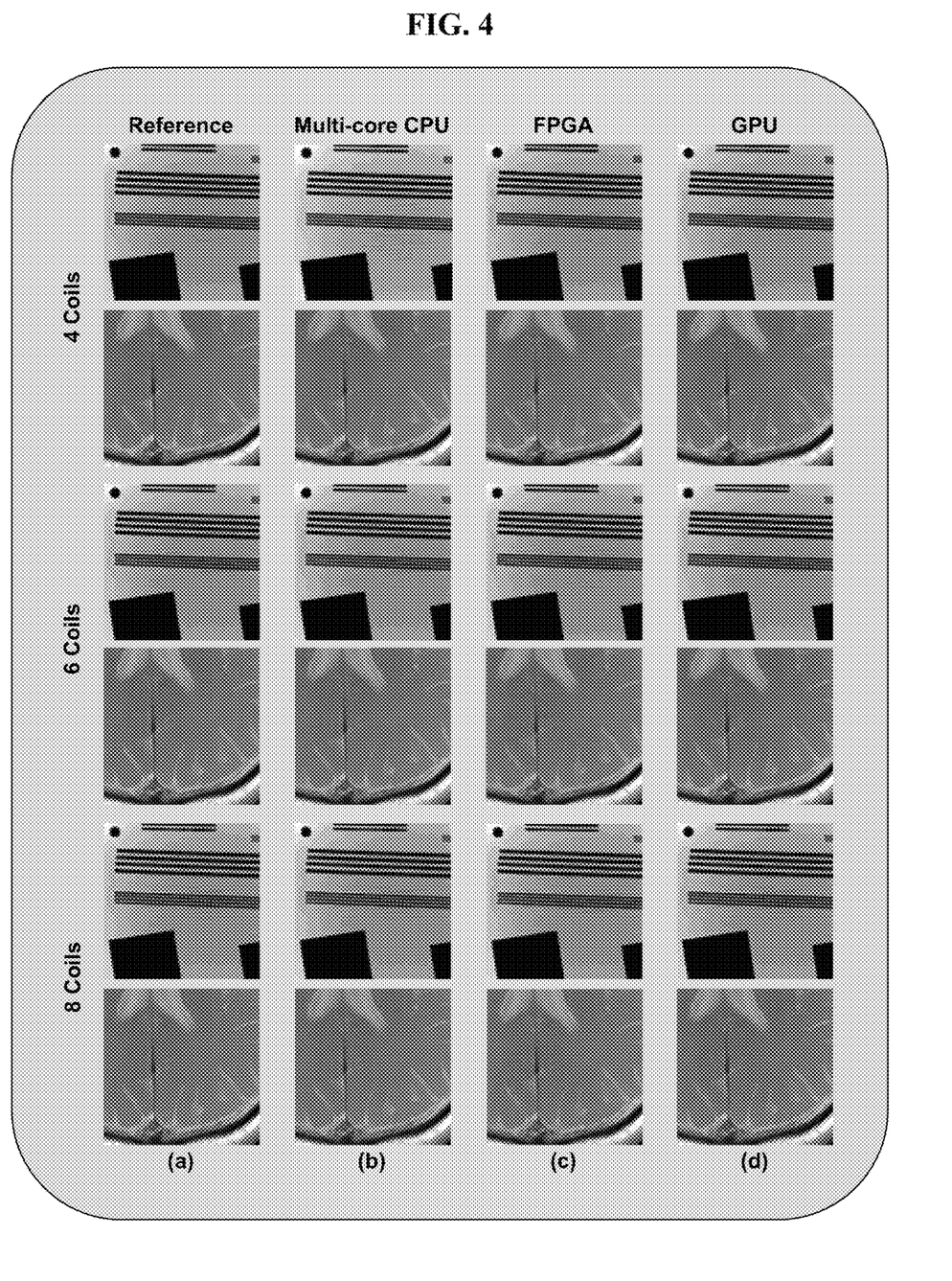
FIG. 4 illustrates magnified section of (a) a Reference image, (b) a Multi-core CPU reconstructed image, (c) a Proposed design reconstructed image, (d) and a GPU reconstructed image.
Figure 5:
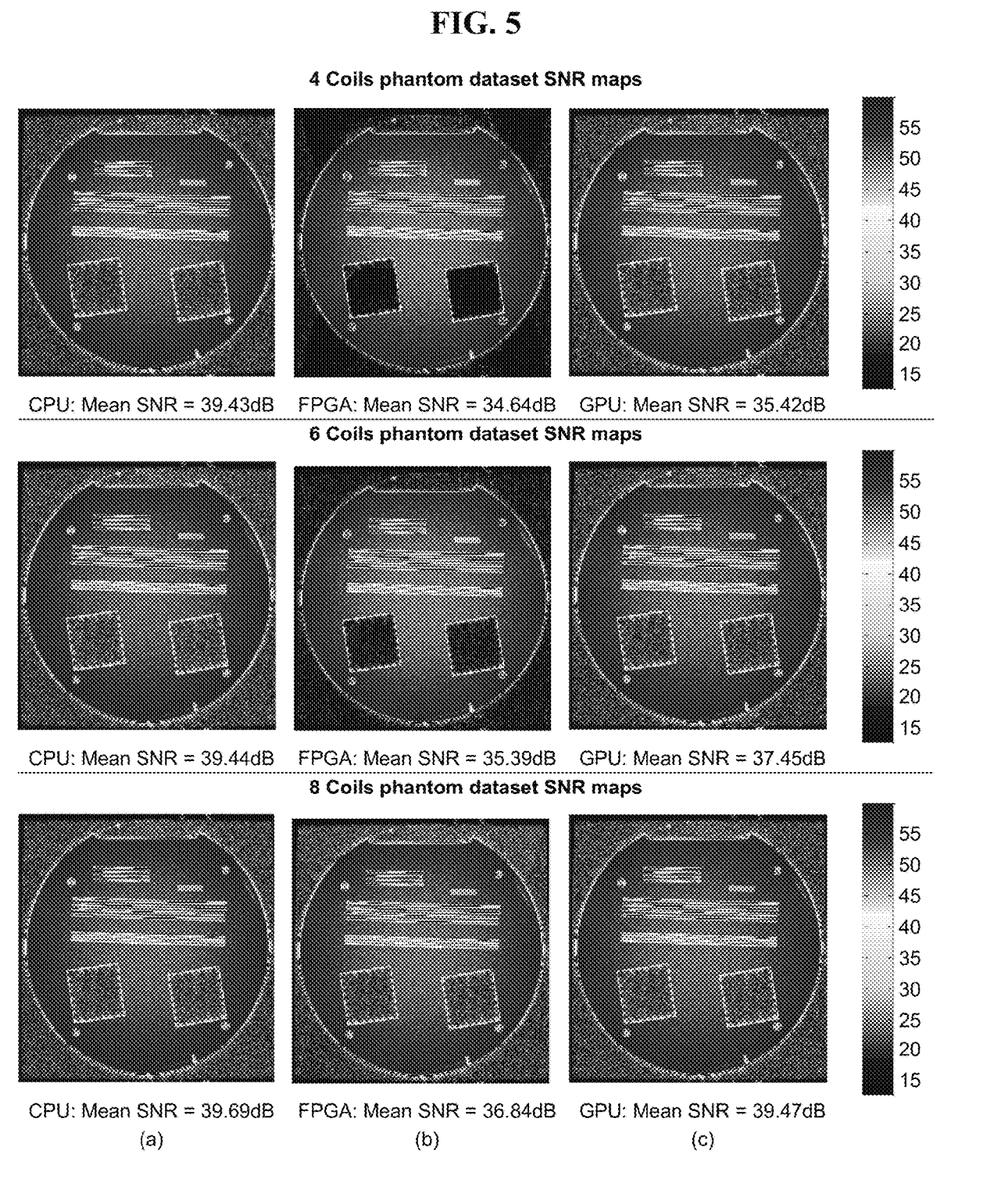
FIG. 5 illustrates SNR maps with mean SNR values of the reconstructed phantom images (a) a Multi-core CPU reconstructed image, (b) a Proposed design reconstructed image, and (c) a GPU reconstructed image.
Figure 6:
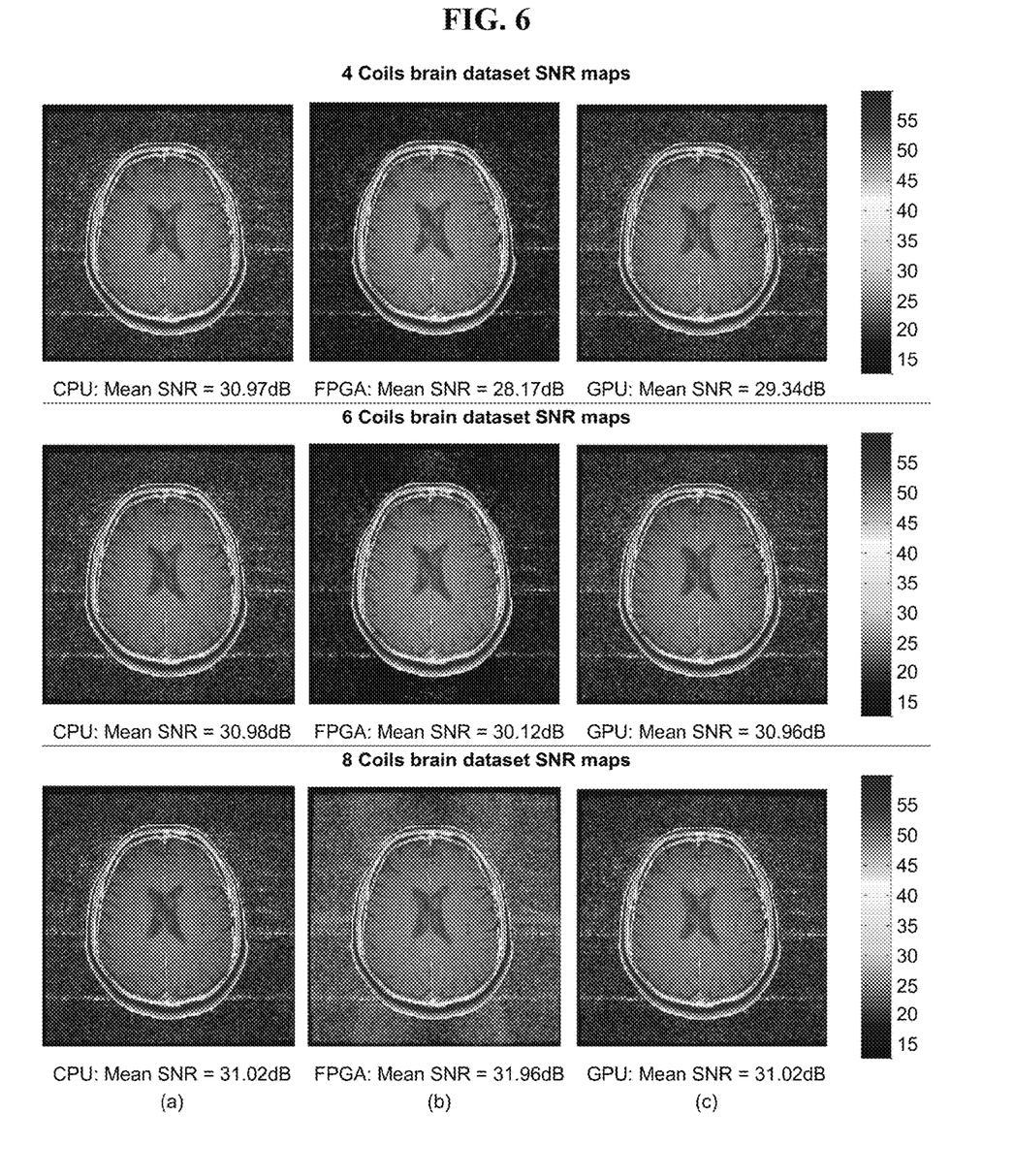
FIG. 6 illustrates SNR maps with mean SNR values of the reconstructed human brain images (a) a Multi-core CPU reconstructed image, (b) a Proposed design reconstructed image, and (c) a GPU reconstructed image.

FIG. 4 shows the magnified (300×) views of the resultant images and the reference images for better comparison. The clarity of the magnified reconstructed images as compared to the reference magnified images shows a remarkable efficiency of the proposed hardware design. For qualitative evaluation, mean signal-to-noise ratio (SNR) of the reconstructed images obtained from the proposed FPGA design and GPU implementations were evaluated using pseudo multiple replica map method. FIG. 5 and FIG. 6 show the SNR maps with the mean SNR values of the reconstructed images for the phantom and human head data, respectively. The mean SNR values of the reconstructed phantom images are more than 34 dB in each case. Moreover, for human head reconstructed images it is more than 28 dB for 4 receiver coils, while it improved to 30+ dB for 6 and 8 receiver coils in the multi-core CPU, GPU and FPGA implementations. The results show that the exemplary architecture implementation has achieved significant mean SNR values in the reconstructed images. This proves that the proposed architecture produces high quality reconstructed images with significant SNR values similar to multi-core CPU or GPU implementations.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A system for parameterized FPGA (Field Programable Gate Array) implementation of real-time SENSE (SENSitivity Encoding) reconstruction, comprising:
   a sensitivity map memory configured to store sensitivity map data;
   an aliased image memory configured to store aliased image data acquired from a scanner;
   a reconstructed image memory configured to store reconstructed image data;
   a parameterized complex matrix multiplier;
   a pseudo-inverse calculator;
   a magnitude image block; and
   a controller;
   wherein the sensitivity map data from the sensitivity map memory is transferred to the pseudo-inverse calculator;
   wherein data from the pseudo-inverse calculator and the aliased image data from the aliased image memory is transferred to the complex matrix multiplier;
   wherein data from the complex matrix multiplier is transferred to the magnitude image block;
   wherein the controller is configured to generate an address of the sensitivity map memory and an address of the aliased image memory to access the sensitivity map data and the corresponding aliased image data and also configured to generate an address of the reconstructed image memory to store the reconstructed image data; and
   wherein the pseudo-inverse calculator further comprises a matrix transposer, matrix multiplier, square matrix inversion calculator, and complex matrix multiplier.

2. The system of claim 1, wherein each of the sensitivity map memory, the aliased image memory, and the reconstructed image memory is accessible by the controller independently.

3. The system of claim 1, wherein the parameterized complex matrix multiplier is configured to compute a matrix multiplication of two matrices having complex values, wherein parameterized feature of the complex matrix multiplier allows the parameterized complex matrix multiplier to be reused for different data-widths complex matrix multiplications.

4. The system of claim 1, wherein the pseudo-inverse calculator is configured to compute the inverse of a non-square matrix.

5. The system of claim 1, wherein the matrix transposer is configured to generate a complex conjugate transpose of a given matrix.

6. The system of claim 1, wherein the square matrix inversion calculator is configured to calculate the inverse of a matrix.

7. The system of claim 1, wherein the magnitude image block comprises at least two square function modules and at least one square root module.

8. The system of claim 1, wherein the magnitude image block is configured to produce absolute of the image from the reconstructed image data.

9. The system of claim 1, wherein the sensitivity map memory, the aliased image memory, and the reconstructed image memory are dual port BRAMs ("Block Random Access Memories"), whereas the number and size of BRAMs used are dependent upon an acceleration factor and a number of receiver coils used for real-time SENSE reconstruction.

10. The system of claim 1, wherein the time for real-time SENSE reconstruction is 0.164 ms @ 200 MHz for 256×256 images where an acceleration factor is 2.

11. The system of claim 1, wherein the time for real-time SENSE reconstruction is less than a MRI data acquisition time.

12. The system of claim 1, wherein the transmission of the sensitivity map data, and the aliased image data skip a workstation of MRI Scanner.

* * * * *